United States Patent [19]

Thornton

[11] Patent Number: 4,907,338

[45] Date of Patent: * Mar. 13, 1990

[54] SUPERCONDUCTING JOINT FOR SUPERCONDUCTING WIRES AND COILS AND METHOD OF FORMING

[75] Inventor: Roy F. Thornton, Schenectady, N.Y.

[73] Assignee: General Electric Company, Schenectady, N.Y.

[*] Notice: The portion of the term of this patent subsequent to Apr. 22, 2003 has been disclaimed.

[21] Appl. No.: 135,859

[22] Filed: Dec. 21, 1987

Related U.S. Application Data

[62] Division of Ser. No. 853,794, Apr. 18, 1986, Pat. No. 4,744,506.

[51] Int. Cl.⁴ .......................................... H01L 39/24
[52] U.S. Cl. ........................................ 29/599; 505/927
[58] Field of Search ............... 420/901; 148/133; 335/216; 174/125.1; 29/599; 228/208, 214, 179, 203; 505/927

[56] References Cited

U.S. PATENT DOCUMENTS

| | | |
|---|---|---|
| 3,262,187 | 7/1966 | Allen . |
| 3,309,457 | 3/1967 | Emery, Jr. ............................ 29/599 |
| 3,346,351 | 10/1967 | Flashman ............................. 29/599 |
| 3,352,008 | 11/1967 | Fairbanks . |
| 3,422,529 | 1/1969 | Nuding . |
| 3,428,926 | 2/1969 | Bogner . |
| 3,449,818 | 6/1969 | Lowe . |
| 3,453,378 | 7/1969 | McInturff . |
| 3,487,538 | 1/1970 | Kakizaki . |
| 3,527,876 | 9/1970 | Karvonen ............................. 505/927 |
| 3,638,154 | 1/1972 | Sampson . |
| 3,895,432 | 7/1975 | Diepers ................................ 29/599 |
| 4,435,228 | 3/1984 | Tachikawa . |
| 4,454,380 | 6/1984 | Turowski . |
| 4,558,512 | 12/1985 | Chaussy ............................... 29/599 |
| 4,586,012 | 4/1986 | Koizumi . |
| 4,631,808 | 12/1986 | Jones .................................... 29/599 |

FOREIGN PATENT DOCUMENTS 0077539 10/1982 European Pat. Off. .
8002084 10/1980 World Int. Prop. O. .

Primary Examiner—Kurt Rowan
Attorney, Agent, or Firm—Mary A. Montebello; James C. Davis, Jr.; William H. Pittman

[57] ABSTRACT

The ends of a plurality of copper conductors bearing superconductive strands, for example of niobium-titanium, are treated with a liquid metal solvent to selectively remove the copper from the superconductive strands. The liberated strands of superconductor are then soldered with a superconducting solder. The joint is included in a coil which at superconducting temperatures induces a high magnetic field of 0.5 Tesla and above.

21 Claims, 3 Drawing Sheets

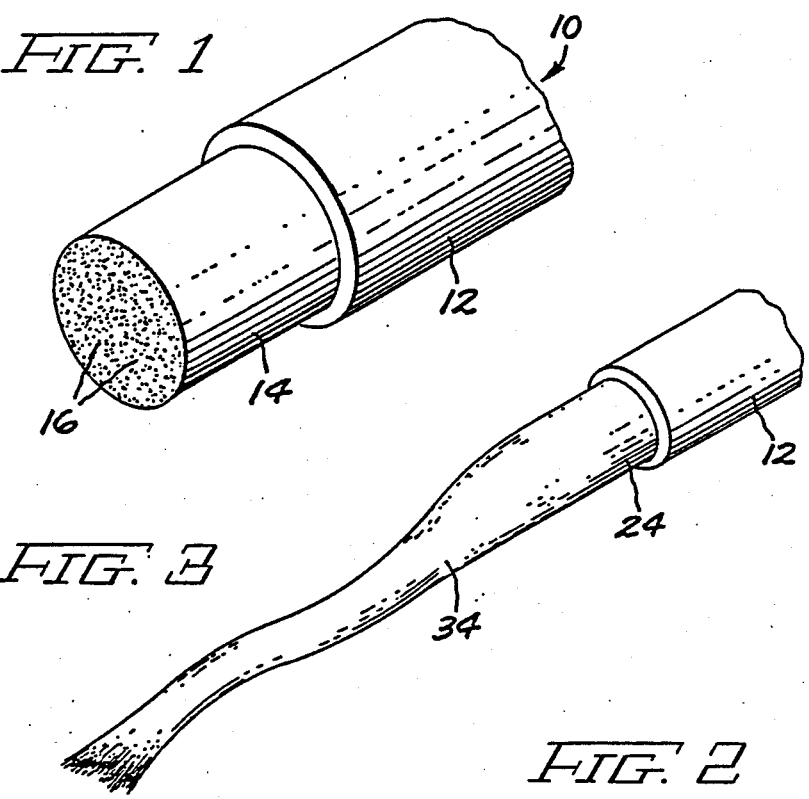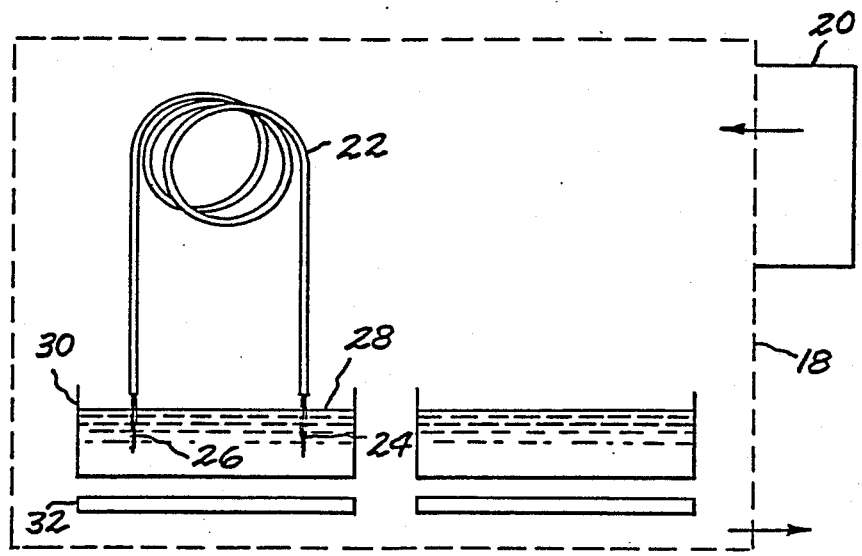

SUPERCONDUCTING JOINT FOR SUPERCONDUCTING WIRES AND COILS AND METHOD OF FORMING

This application is a division of application Ser. No. 853,794, filed Apr. 18, 1986 now U.S. Pat. No. 4,744,506.

BACKGROUND OF THE INVENTION

The present invention relates to electrically joining superconductor cables. More particularly it relates to forming superconductor coils from such cables by formation of superconducting solder joints.

Many alloys of niobium and titanium have been found to be superconducting at the temperature of liquid helium. It is a common practice in the industry to embed a superconducting material within a carrier or matrix metal such as copper, copper-nickel alloy, or similar matrix conductor. In the case of a wire made of niobium-titanium alloy the alloy can be made up into the form of filaments and these filaments can be incorporated by conventional means and methods within a copper wire to form an array of the niobium-titanium filaments within the bulk of the copper carrier as a matrix. The formation of superconductors into wire form is convenient when the wire is used for a winding or coil to form a magnetic field within a loop or loops of superconducting wire. One problem in forming such loops is that at least one point, and more commonly a number of points in a superconducting coil, it requires that the wire and the elements of the wire be joined to form a continuous path through which the superconducting current can pass in generating the very high magnetic field.

While a number of successful methods have been found for forming a continuous loop by forming a joint between two wire ends, or between the two ends of a single wire, nevertheless there are needs for improved joints of superconducting wire and the present invention provides such an improved joint. The joint of this invention is illustrated by the joining together of the superconducting elements or filaments of a copper matrix wire which matrix has incorporated therein a number of filaments of niobium-titanium alloy stretched out into superconductive filaments extending through the length of the wire.

One way in which a measure can be made of the relative merits of the superconducting joint of a superconducting wire is by measuring the degree to which it remains superconducting at liquid helium temperatures at high currents and under magnetic fields such as a field of 2000 gauss. The superconducting joint of the subject invention does remain superconducting at liquid helium temperatures and with the passage therethrough of high currents of over a hundred thousand amperes per square centimeter of superconductor when subjected to magnetic fields of at least 2000 gauss. The joints of this invention carry currents approaching the current carrying capacity of the superconductor wires and cables which are joined.

With regard to the operation of superconducting wire in its normal environment, for some applications of superconducting magnets, operation in the persistent mode is desirable. To establish the persistent mode an electromagnet wound with superconducting wire is cooled to superconducting temperature and is energized with an external direct current. After the external power supply is disconnected, the current and magnetic field stabilize and thereafter do not decay if all of the joints are superconducting.

A number of publications and patents deal with niobium-titanium superconductors and methods and means of forming joints between such superconductors.

One such publication is an article appearing in the October 1977 issue of Welding Journal starting at page 23 and entitled "Soldering of Copper-Clad Niobium-Titanium Superconductor Composite" and dealing with use of a variety of solders and fluxes. The solder joints were not superconducting. No flux was found which permitted and/or caused the solder to wet the superconducting filaments. The subject method does not employ fluxes at all.

A method of forming a superconductive butt joint between copper clad niobium-titanium superconductors by overwrapping the butt joint with smaller shunt superconductors and attaching the shunt in place by solder including a lead-bismuth solder is disclosed in U.S. Pat. No. 3,453,378. Various prior art methods of forming superconducting joints are disclosed in this patent as well as problems arising from failure of such joints.

The properties of various solders including solders containing lead and bismuth potentially useful to form superconducting joints are disclosed in the article entitled "Superconductivity Measurements in Solders Commonly Used for Low Temperature Research" appearing at page 180 of Reviews of Scientific Instruments, Vol. 40, January, 1969.

A superconductive connection involving use of solders is described in U.S. Pat. No. 3,346,351 assigned to the same assignee as the present application.

A variety of superconducting solders and their uses are described in U.S. Pat. No. 3,156,539 also assigned to the same assignee as the subject application.

Formation of a superconducting joint employing a combination of a superconducting low melting alloy containing combinations of lead-bismuth-tin and an outer crimped sleeve are taught in U.S. Pat. No. 3,449,818.

Accordingly, the use of solders or low melting combinations of molten metals in efforts to form so-called "soldered" superconducting joints is well known but varying degrees of success have been achieved in forming joints with a significant degree of superconductivity. The present invention provides solder joints having a significant degree of superconductivity and does so efficiently and economically.

The Applicant is not aware of any article, patent or other information which has taught or has made possible formation of superconducting solder joints between superconducting wire ends according to the method of this invention. Applicant is also not aware of a superconducting joint which can be constructed with the relative simplicity and reliability and at the low cost of the joints of this invention. Moreover, the Applicant is not aware of any teaching of superconductive joints formed by simple measures according to this invention employing superconducting solder, which joints remain highly conductive under magnetic fields of at least 2000 gauss. Further no low cost method is known for forming solder joints which have high quench currents of more than a hundred kiloamperes per square centimeter of semiconductor and up to levels approaching the current carrying capacity of the superconducting wire or cable which is joined.

OBJECTS

It is accordingly one object of the present invention to provide a method by which superconducting strands encased within a first conductor may be joined electrically to a second set of superconducting strands of the same or of another conductor to provide an effective superconducting joint.

Another object of the present invention is to permit formation of superconducting wire joints with minimum apparatus, means or mechanisms.

Another object is to provide a method for forming superconducting wire joints at low cost and yet with high reliability.

Another object of the present invention is to permit the formation of superconducting coils to generate high magnetic fields at relatively low costs.

Another object is to make it possible and convenient to form several joints in a winding or a coil of a superconducting magnet with high reliability.

Another object is to form a joint between sets of superconducting elements capable of carrying high currents and remain in the superconductive state while cooled near 4.1° Kelvin and further to do so while the joint is within a magnetic field of at least 2000 gauss.

Another object is to permit formation of superconducting wire joints using procedures that do not heat the superconducting filaments to a temperature at which the superconducting properties are diminished.

BRIEF SUMMARY OF THE INVENTION

In one of its broader aspects the objects of the present invention can be achieved by providing a plurality of ends of superconducting wire formed with a plurality of strands of superconductor in a conductive carrier metal as a matrix, dissolving the carrier metal away from the ends of the superconductor strands in a solvent liquid metal bath under conditions which limit formation of oxide coating on the superconducting strands, immersing the liberated superconducting strands in a molten metal bath of superconducting solder to replace the liquid metal solvent from the strands and to enhance superconductivity between the strands, bringing a first set of liberated strands into close proximity with a second and different set of liberated strands to make two sets of superconducting strands proximate over an appreciable length thereof while wetted with the molten metal of the molten metal solder bath, and allowing the molten metal solder to solidify to hold the sets of liberated strands in close proximity embedded therein.

In another of its broader aspects the objects can be achieved in accordance with the above method but employing a single metal bath as both a solvent bath and a superconducting solder bath.

The invention includes the above methods, as well as the article formed by the above methods.

It also includes intermediate articles formed by dissolving matrix metal from superconducting strands and articles having liberated strands of superconducting metal immersed in and frozen in superconducting solder.

Further it includes superconducting coils and other structures having superconducting joints as provided herein.

BRIEF DESCRIPTION OF THE DRAWINGS

The description of the invention which follows will be made clearer by reference to the accompanying drawings in which:

FIG. 1 is a perspective end view of the end of a matrix conductor in which is embedded an array or set of superconducting strands.

FIG. 2 is a schematic view of a length of the conductor of FIG. 1 having its ends immersed in a first liquid metal.

FIG. 3 is a schematic view of a conductor end with liberated strands of superconductor extending therefrom.

DETAILED DESCRIPTION OF THE INVENTION

In carrying out the method of the present invention and forming articles provided by the present invention, explanation of the invention is facilitated by reference to the accompanying drawings. Referring first to FIG. 1, a wire 10 having an insulating cover 12 and a copper body 14 is provided with a number of strands of an internally extending superconducting metal 16 which illustratively may be niobium-titanium metal. The wire 10 is a commercially available product prepared from billet by swaging and drawing and does not form part of the invention.

Figure 8:
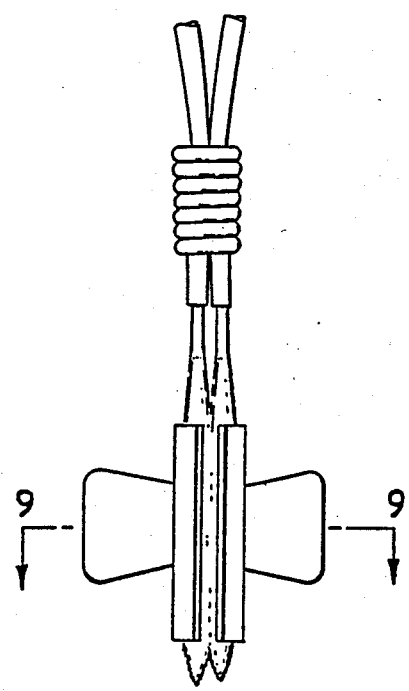
FIG. 8 is an elevational view of the clamp and wire ends of FIG. 7 after the clamp has acted on solder-laden wire ends.
Figure 9:
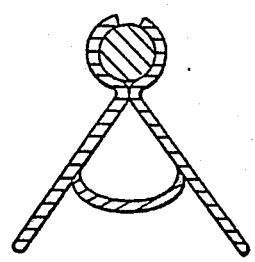
FIG. 9 is a horizontal sectional view of the closed clamp and wire ends of FIG. 8.

Various configurations of superconducting coils are wound from wire such as that illustrated in FIG. 1. The wires themselves cannot be made of indefinite length so that it is necessary to form joints between pieces of wire in order to form the superconducting coils. Superconducting coils are closed loop coils, the simplest form being a single wire such as 10 having its two ends joined in a superconducting joint as illustrated in FIGS. 8 and 9.

Such coils have many uses one of which is in the nuclear magnetic resonance measurements (NMR). For some applications of NMR the formation of relatively large coils of the order of more than a meter in diameter is necessary. Such larger coils can establish relatively high static magnetic fields of the order of 0.5 tesla or higher within the area encompassed by the coil. The use of superconductors at liquid helium temperatures to generate such high static fields of relatively large size is contemplated for use in the NMR technology. The present invention is one method by which formation of such coils is made feasible inasmuch as it makes possible the joining of wire sections used in forming such a coil. The joints of the present invention permit the flow of relatively high levels of current in and through such coils in the persistent mode.

Examples of commercially available wires which are useful in the practice of the present invention are wires manufactured by the Intermagnetics General Corporation, by SuperCon of Natick, Mass., by AIRCO Corporation, and by others some details of which are set forth in specific examples below.

Referring next to FIG. 2 there is illustrated in a schematic fashion an enclosure 18 having a controlled atmosphere which may, for example, be an inert atmosphere such as argon. Use of such a controlled atmosphere is deemed desirable but not essential in the practice of the present invention. The enclosure may be provided by a conventional structure such as a glove box. A glove box is an enclosure in which articles can be manipulated by means of gloves which extend from the inner walls to permit an operator to insert his hands to carry out the manipulation while standing outside of the enclosure. The inert gas used in such a device in connection with the present invention should preferably be essentially pure argon or other suitable inert gas with very low oxygen content and with very low moisture content. Such gas is supplied to a glove box 18 by a gas supply 20 in the schematic representation of FIG. 2, preferably at a positive pressure to permit gas escape from the box but to prevent ambient air ingress into the box.

A wire sample 22 is first prepared by removing the insulating layer 12 from each end of the wire sample. The wire is introduced into the controlled atmosphere of box 18 through suitable locks.

A first treatment is applied to the wire ends to dissolve the copper 14 from around the strands 16 of superconductor. It has been found that such removal can be accomplished efficiently by immersing the wire ends 24 and 26 into a bath of liquid metal 28 contained within a suitable container 30 which may, for example, be a glass beaker or carbon crucible. Heater means 32 are provided within the box 18 for maintaining the temperature of the liquid metal bath 28 at a suitable temperature in the neighborhood of 350°–450° C. Higher temperatures of the order of the temperature at which the properties of superconductor begins to degrade may be used. Also lower temperatures down to the melting point of the metals of the two baths can be employed.

The various articles described as well as the enclosure gas supply, etc. are not shown in their normal size relationships but are illustrated schematically for purposes of clarity of description and understanding. For example, the amount of the liquid metal 28 which is necessary to dissolve the copper from the wire ends 24 and 26 is quite small inasmuch as these wire ends are quite small. The actual amount of metal may be in the order of 50 milliliters in a relatively small beaker and this will suffice to permit the copper to be dissolved from the wire ends by swirling and swishing the wire ends in the liquid metal. The solvent liquid metal may preferably be tin, and solution of the copper in the tin thus liberates the superconducting strands from the wire matrix in which they are normally contained. The solvent liquid metal also coats the strands of superconductor with a layer which protects the surface of the strands from oxidation.

Turning now to FIG. 3 there is illustrated a wire end 24 which has been treated as described above to dissolve copper from the superconducting strands. The figure, which is again schematic, illustrates a length of the conductor 24 from which insulation 12 has been removed and also a length of the liberated strands 34 which are held in a congealed body of solvent metal which had frozen in place about the strands.

Figure 4:
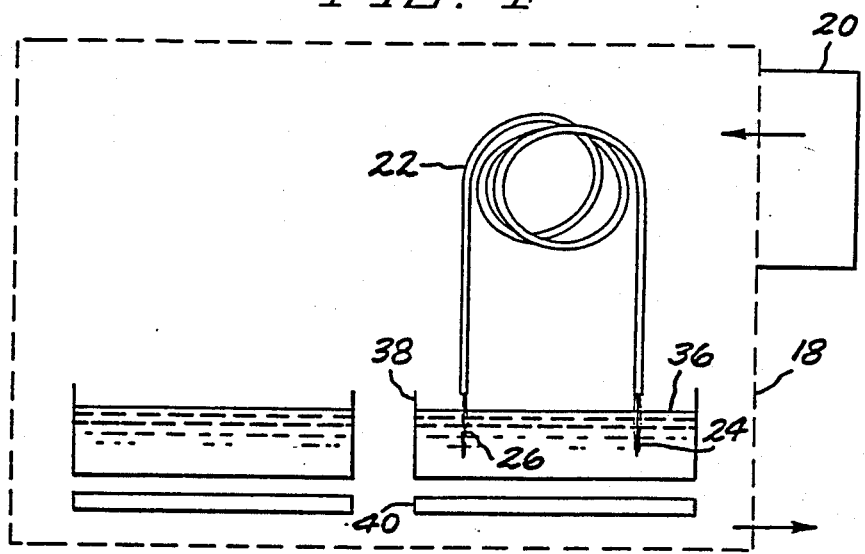
FIG. 4 is a similar schematic view of the same length of conductor having its ends immersed in a second liquid metal.

Turning next to FIG. 4 there is illustrated again in schematic fashion, a figure similar to that of FIG. 2. An enclosure 18 which may be a conventional glove box is provided with a protective gas atmosphere through gas source 20 as described above. A second molten or liquid metal bath 36 is provided within the container 38 and the liquid metal bath is maintained molten and provided with heat from heat source 40.

The coil 22 treated as described above with reference to FIG. 2 is immersed at its ends 24 and 26 into the liquid metal 36 of the bath to effectively replace the solvent liquid metal from the first bath with that of the second bath and to effectively apply to the liberated strands of the wire ends a liquid metal solder and particularly a superconducting solder.

One such solder which has been used particularly effectively as the liquid metal 36 is a composition of lead and bismuth in which the lead is preferably in the range of 44% to 70% and in which the remainder of the liquid is bismuth. Accordingly the bismuth in these preferred solders is in the range of 56% to 30%.

Operability of the process of the present invention is deemed feasible with superconducting molten metal baths of from 5 to 98% lead and the remainder bismuth.

One solder metal product which is used and has been found useful in the treatment of the strands and application of a superconducting metal is the commercially available product known as Cerrometal. This composition has a bismuth content of about 56% and is supplied by Cerro de Pasco Corporation.

After the wire ends 24 and 26 were swished around in the liquid metal bath 36 for a few minutes the superconducting solder had replaced the solvent liquid metal to a large degree and it was possible then to proceed with the formation of a joint.

Figure 5:
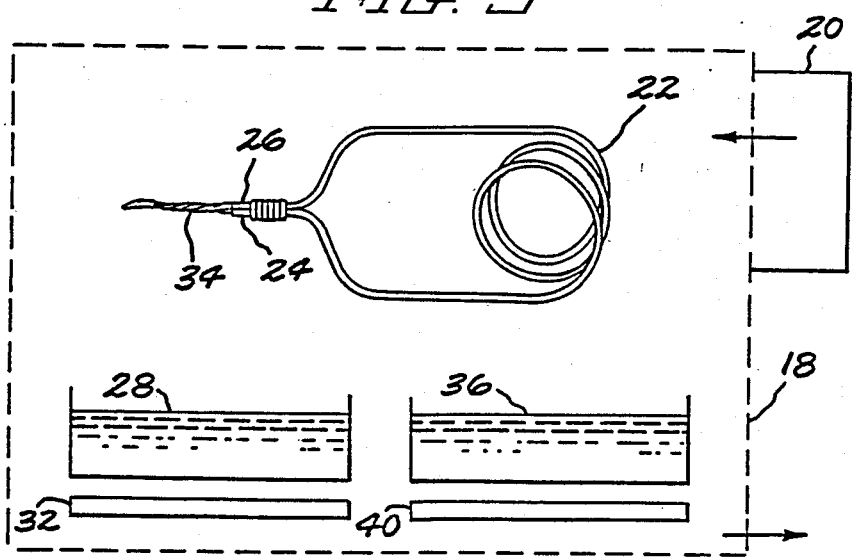
FIG. 5 is a view of a joint formed by contacting the liberated ends of superconducting strands.
Figure 5A:
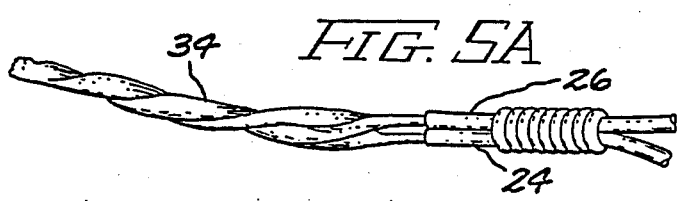
FIG. 5A is a detailed view of the joint as illustrated in FIG. 5.

The formation of the joint is schematically illustrated in FIG. 5 where the parts have the same designation as those in the earlier FIGS. 2 and 4. The wire sample 22 is first moved upward to remove the wire ends 24 and 26 from the bath 36. The liberated ends of the two wires with the adherent liquid metal solder thereon are twisted and held together while the liquid metal solder is still molten. Any convenient tool, not shown, may be used to hold and twist the hot wire ends and molten solder. The liquid metal solder is then allowed to freeze while the strands of superconductor are held within the liquid metal solder and are accordingly frozen into place in the solder.

Because there is extensive contact between the strands of superconducting niobium-titanium and the liquid metal solder and inasmuch as both are superconducting materials the current carrying capacity of the joint which is thus formed is quite high at liquid helium temperatures. Thus, the superconducting joint formed by the method of the present invention is capable of carrying a very high level of current in its superconducting condition to the extent that the joint carries a significant portion of the current carrying capacity of the wire itself.

The following are examples of the manner in which the method of the present invention has been practiced to produce superconducting coils of this invention.

EXAMPLES 1-8

A first set of test superconducting loops was prepared to have a single superconducting joint in a single piece of wire of about 15 inches in length. Each wire was a composite of 480 strands of niobium-titanium alloy filaments of approximately 47 micron diameter embedded in a copper matrix having a crossectional size of 0.040 inches by 0.090 inches. The wire is sold under the commercial designation IGC5152 by Intermagnetics General Corporation.

About two inches of each end of each 15 inch piece was bared of insulation to expose the clean copper surface. A single loop was formed of each wire and the two wire ends were clamped above the exposed ends of the wire to orient the two wire ends in parallel.

Each wire loop as thus prepared was placed in an argon-filled glove box.

Molten skimmed tin was placed in a glass tube outside the glove box and the tube was evacuated for one hour using a mechanical vacuum pump and a liquid nitrogen cold trap while the molten tin was held at 450° C.

The degassed tin was transferred under vacuum into the glove box where about 40 ml were decanted into a 50 ml beaker.

An alloy of 70 weight percent (wt%) lead and 30 wt% bismuth was prepared and this alloy was degassed in the same manner as the tin. The molten lead-bismuth alloy was transferred to the glove box under vacuum and 40 ml were decanted into a 50 ml beaker.

The procedure for making a joint from a wire was as follows. The two bared ends of each wire were immersed one wire at a time in molten tin at 350° to 400° C. Occasional stirring of the tin with the wire ends and careful flexing of the brush of exposed superconducting strands of niobium-titanium speeded the dissolution and removal of the copper matrix from around the filaments. After about one half hour the copper had been dissolved, leaving a brush-like bundle or set of niobium-titanium filaments coated with tin.

The filament bundles of a specimen looped wire were then dipped in the lead-bismuth alloy at 350° to 400° C. and stirred gently. A short period of one to two minutes was sufficient to displace the tin with the lead-bismuth alloy in this manner. The wire ends were then removed from the melt and the alloy wetting the filaments was allowed to solidify.

Two methods were used to form the superconducting joint between the two sets of liberated filaments.

According to the first method, the two sets or bundles of filaments of the same wire were held parallel and adjacent and were dipped in the molten lead-bismuth alloy. The dipped ends were withdrawn and the two sets of filaments were twisted together while the alloy was still molten to enhance conductivity and to establish a potential superconducting pathway between the two sets of niobium-titanium filaments. The alloy was then allowed to solidify while the contact established by the twist was maintained.

Figure 6:
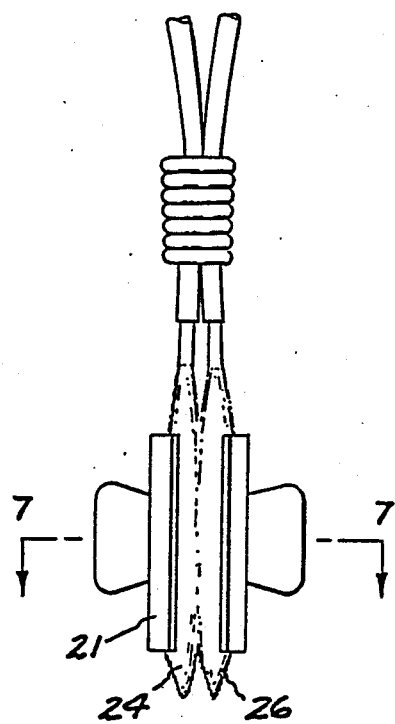
FIG. 6 is an elevational view of a clamp poised for clamping solder bearing wire ends to form a joint.
Figure 7:
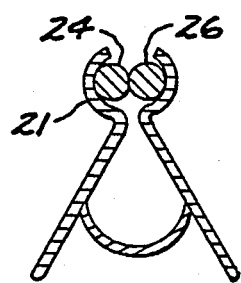
FIG. 7 is a horizontal sectional view of the clamp and wire ends of FIG. 6.

By a second method described with reference to FIGS. 6 and 7, the sets or bundles of filaments coated with the lead bismuth composition (24 and 26) were placed together and a spring clip 21 was used to hold the filament sets together. The sets of filaments with the spring clip mounted in place were then immersed in the molten lead-bismuth alloy. As the heat of the molten alloy caused the alloy in the bundle to melt, the clip cinched both sets of filaments into at least one tight bundle and brought the filaments into such a close proximity in the superconducting solder that a potential superconducting pathway was established between the two sets. The filaments and clip were then withdrawn from the molten lead-bismuth alloy and the matrix solder alloy interspersed with the filaments was allowed to solidify. The particular clips used were not wetted by the alloy and were easily removed from the cinched sets of filaments embedded in the superconducting alloy.

The specific method of holding the filament sets together during solidification of the solder is not critical to this invention.

A series of tests of the superconducting capacity of the series of eight joints formed on the eight wire samples by the methods as described above were carried out.

The identification of the test samples, the type of wire used in the test, the manner of urging the strands of niobium-titanium alloy together, the strength of the magnetic field and the quench current are all listed in Table I below.

TABLE I

| Example No. | Wire Type | Joining Method | Mag. Field, in kilogauss | Quench Current,* kiloamp/cm² |
|---|---|---|---|---|
| Ex. 1 | IGC | twisted | 0 | 233-250 |
| Ex. 2 | IGC | twisted | 2-3 | 216-233 |
| Ex. 3 | IGC | twisted | 0 | 233-250 |
| Ex. 4** | IGC | twisted | 0 | 258-278 |
| Ex. 5** | IGC | twisted | 2-3 | 249-268 |
| Ex. 6*** | IGC | twisted | 0 | 75 |
| Ex. 7 | IGC | twisted | 0 | 185-200 |
| Ex. 8 | IGC | wire clips | 0 | 238-257 |

*Based on the cross-sectional area of the Nb/Ti filaments
**After part of the filament bundle was cut off.
***Solder alloy for this joint only was 64 wt % Pb, 27 wt % Bi, 9 wt % Sn.

EXAMPLE 9

A test loop was prepared to have a single superconducting joint in a piece of wire about 15 inches in length using the method of Examples 1-8.

The wire of this example was manufactured by AIRCO Corp and had an outer conductor cross-section of 0.0269 inches diameter containing 823 filaments of niobium-titanium having a superconductor cross-section of 0.00123 square centimeters, each filament diameter being approximately fourteen microns in a copper matrix.

A test of the quench current of the loop prepared by this example was made using the first method and it was found that the current-carrying capacity of the joint at 4.1° K. was 500 to 600 kiloamperes per square centimeter of superconductor.

The results of this test procedure are listed in Table II below:

TABLE II

| Example No. | Wire Type | Joining Method | Mag. Field, in kilogauss | Quench Current* kiloamp/cm² |
|---|---|---|---|---|
| Ex. 9 | Airco | twisted | 0 | 500-600 |

EXAMPLE 10

A test joint prepared by one of the methods of Examples 1-9 was examined using a scanning electron microscope. It was observed from the X-ray diffraction study that the region of the joint around the individual strands of niobium-titanium contained evidence of residual tin at the surface of the alloy. A marked decrease in tin content was observed in the solidified metal between the strands.

From this study it was concluded that it was not necessary to remove tin completely from the niobium-titanium strands in order to have an effective superconducting joint.

Also it appeared feasible that the tin surface coating the niobium-titanium strands was associated with the niobium and did not detract from the superconductivity of the joint for this reason.

EXAMPLE 11

A sample of a superconducting joint was prepared as described in Examples 1 through 8 with the exception that the use of the glove box was omitted.

Tin and lead-bismuth were heated in their respective beakers by burners fueled by hydrogen gas to temperatures of about 450° C. in the open laboratory and not under a protective atmosphere other than the atomosphere created by the burning hydrogen. All other manipulations of the wire were carried out as described above in Examples 1-8 but all were done in the laboratory atmosphere.

Measurements were made as described above and the following results were obtained as are plotted in Table III below.

TABLE III

| Example Number | Wire Type | Joining Method | Magnetic field in kilogauss | Quench current* kiloamperes/ square cm. |
|---|---|---|---|---|
| 11 | IGC | Twist | 0 | about 143 |

The above example 11 illustrates that it is possible though not preferred where higher quench currents are sought to dispense with the use of special atmosphere to protect the molten tin as well as the molten lead-bismuth in their respective beakers, and also to dispense with a protective atmosphere around the joint as it is twisted and formed.

Some precautions taken in this example to minimize exposure of the components made to the atmosphere were in heating the tin bath and lead-bismuth bath with a hydrogen fueled burner, applied beneath the respective beakers, moving the joint as quickly as possible from the liquid tin bath to the lead-bismuth bath, and quickly twisting the solder coated strands in air using duck-bill pliers. The use of the hydrogen fuel was to minimize oxygen access to the liquid metal in the beakers.

EXAMPLES 12-14

Three test loops were prepared using essentially the procedure as described above for examples 1-8.

The wire used was a product of SuperCon Inc of Natick, Mass. having outer copper-nickel conductor containing 70% copper and 30% nickel and had outer dimensions of 0.050 in by 0.100 inches.

The conductor contained 1591 filaments of niobium titanium each having a diameter of approximately 32 microns each coated with a thin copper layer and all embedded in the copper-nickel alloy matrix.

The cross-sectional area of superconductor was 0.0129 cm$^2$.

The results are plotted in Table IV below.

TABLE IV

| Example Number | Wire Type | Joining Method | Magnetic field in kilogauss | Quench current* in kiloamperes per cm$^2$ |
|---|---|---|---|---|
| 12 | Supercon | twist | 0 | 160 |
| 13 | Supercon | twist | 0 | more than 233 |
| 14 | Supercon | twist | 0 | more than 226 |

EXAMPLE 15

A wire was prepared as described in example 9 with the exceptions that a sleeved joint was formed rather than a twisted joint. The forming method was to slide a stainless steel sleeve over the bundles of filaments while the lead-bismuth solder was molten and to allow the solder to solidify while the sleeve remained in place about the coated filaments. Tests were performed as in the above examples and the results are given in the accompanying Table V.

TABLE V

| Example Number | Wire Type | Joining Method | Magnetic Field | Quench current* in kiloamperes/cm$^2$ |
|---|---|---|---|---|
| 15 | Airco | sleeve | 0 | more than 609 |

The results which have been obtained from experiments in preparing joints according to the present invention have demonstrated that a novel process for the formation of joints having very high current-bearing capability is made possible. Not all of the joints which were prepared have a very high current-bearing capability.

For example, Example 6 of the experimental examples given above was made to include a percentage of tin amounting to about 9%. The quench current of the joint prepared with the solder alloy containing 9% tin was approximately 75 kiloamps per square centimeter of superconductor. This value while significant and appreciable in comparison to prior art joints was considerably below the value of other joints prepared with solder alloy compositions containing the lead and bismuth. From this experiment, it was concluded that the presence of large amounts of tin in the solder alloy employed is detrimental to the achievement of the higher quench currents found with solder alloy in which trace or small amounts of tin were present.

These results are contrasted with those reported in Example 9. In Example 9 a joint was examined under a scanning electron microscope and it was determined that tin was present at the surface of a superconducting filament of a joint and apparently did not interfere with the high current carrying capacity of that joint.

Further, it is deemed by the inventor to be advantageous to minimize the presence of water vapor and also of oxygen in the solder alloy compositions employed in some joints of this invention. Thus, it was observed during the formation of the joints that as the solder compound became older, it tended to develop a crust which was attributed to the formation of oxide from the molten material and it was observed that as wires were withdrawn from the solder alloy bath containing a crust of metal oxide, the value of the quench current of the joint prepared in such bath was lower than in those cases where a fresh batch of molten alloy was employed.

Further, it has also been observed that the solder alloy baths which contained a higher percentage of bismuth tend to have higher quench current values and, accordingly, the use of baths having a high range of concentration of bismuth is deemed advantageous for preparation of certain joints.

While the foregoing description is given with reference to the dissolution of a copper matrix from a superconductor wire of the type shown in FIG. 1, it is also feasible pursuant to the present invention, to employ wires which contain a copper-nickel matrix or a copper-nickel layer, and nevertheless, to dissolve away matrix metal from the superconductor and to achieve a good superconducting joint as taught by the present invention. This is illustrated in examples 12 through 14.

One of the apparent problems which has existed in relation to the formation of good bonds between a superconducting metal such as niobium-titanium and a superconducting material which is to be connected electrically is that the niobium-titanium does have a strong tendency to form oxide. It is believed that formation of oxide at the surface of the superconducting material can detract from making an effective superconducting connection between the superconductor strands the surface of which has been coated by oxide and a second superconductor metal such as a superconductor solder metal.

According to the present invention, the formation of the deleterious oxide at the surface of the superconducting metal is to a large degree avoided by treatment of the conductor containing the superconducting strands with a liquid metal solvent which is effective in removing the matrix metal and which wets the surface of the strands. The action of solvent metal on the matrix metal does not impart to the surface of the liberated strands a coating of oxide which interferes with the conductivity between the superconductor and the joint metal through which conduction must be carried to the superconducting strands of a second wire or cable. Accordingly, it is one of the findings of the inventor of the subject application that beneficial avoidance of the formation of oxide can be accomplished through the method disclosed and taught herein.

In addition, the joint can be formed to lock the superconducting filaments liberated from the matrix metal into the superconducting solder metal without a deleterious oxide layer forming between the liberated strands of the superconducting strands and the surrounding solder metal. As a consequence of the effective mode of connection, coils can be formed which have a higher current-carrying capacity approaching approximately that of the superconducting wire or cable used in winding the coil. These joints have higher conducting capacity than joints which have been conveniently feasible heretofore, particularly at the low cost provided by the subject application.

Further, to attain a certain magnetic field strength, it is possible to achieve such field strength without the use of as much superconducting wire and cable as has been used heretofore because the wire and cable and joints which form part of the conducting path are able to carry higher current loads. Such higher efficiency is achieved primarily because the joints formed are also capable of carrying the higher ampere density, and the number of windings of wire in a coil which must be used in forming such a coil is reduced through the use of the present invention.

Alternatively wire of reduced cross section of superconductor can be used to generate a field equivalent to that generated by coils having prior art joints.

With regard to the formation of larger individual coils, it may be necessary because of the larger amount of the superconductor which is employed in such coil to make a number of joints joining one conductor to succeeding conductor in the overall single coil structure. It is apparent that when the individual wire segments or cable segments of such a large coil are connected in series that any one joint of the series, which is deficient can cause an overall failure of the coil.

Also for specific magnet configurations and structures joints may be formed to link a number of aligned individual coils. In magnet structures prepared for use in NMR medical applications a number of coils were prepared and the coils were spaced coaxially along a path through which patients could be passed for diagnostic study. It is feasible through use of the present invention to link the individual spaced coils with joints as taught herein.

One of the features of the present invention is that the joints which are formed pursuant to the invention have such high current carrying capacity that even those joints which are not optimum in their current carrying capacity are nonetheless adequate to support the flow of very high currents through a superconducting coil and are capable of operating in the persistent mode.

It will be understood that the solvent metal and the superconducting solder need not be separate and distinct. Rather it is within the scope of this invention to employ a superconducting solder metal as a solvent metal. Thus it is feasible to dissolve the copper matrix metal from the niobium-titanium superconducting filaments employing a lead-bismuth solvent metal of a composition as described above. Further a lead-bismuth solvent metal may also serve as a superconducting solder in forming a superconducting joint also as described above.

The method of the present invention includes the liberation and forming of wire ends and wire-to-wire joints with other superconductors, such as niobium-tin, from their embedment in copper and alloys of copper or other metals and embedding the liberated filaments in superconducting solder.

What is claimed and sought to be protected by letters patent of the United States is as follows:

1. A superconducting wire end adapted for being joined to other superconducting wire ends,
    said wire end having a plurality of superconducting filaments embedded in a matrix metal in one portion of said wire end,
    said filaments being liberated from and extending from said matrix in another portion of said wire end and being embedded in a superconducting solder metal.

2. The wire end of claim 1 wherein said filaments are less than 100 microns in diameter.

3. The wire end of claim 1, wherein the super-conducting filaments are niobium-titanium.

4. The wire end of claim 1 wherein the solder metal is lead-bismuth containing from 5 to 98% lead and the remainder bismuth.

5. The wire end of claim 1 wherein the solder metal is lead-bismuth containing from 30 to 56% bismuth and the remainder lead.

6. The wire end of claim 1 wherein the matrix metal is copper, the superconducting filaments are niobium-titanium and the superconducting solder is lead-bismuth containing from 5 to 98% lead and the remainder bismuth.

7. A superconducting joint comprising a plurality of superconducting filaments of niobium-titanium conductor, each filament extending from one of two matrix metal wire ends, said filaments of each matrix metal wire end extending into and embedded in a solder joint of superconducting solder metal.

8. The superconducting joint of claim 7 wherein said filaments are less than 100 microns in diameter.

9. The superconducting joint of claim 7 wherein the matrix metal is selected from the group consisting of copper and alloys of copper.

10. The superconducting joint of claim 7 in which the solder joint is a eutectic of lead and bismuth.

11. The superconducting joint of claim 7 wherein the superconducting solder metal is lead-bismuth containing from 5 to 98% lead and the remainder bismuth.

12. The superconducting joint of claim 11 wherein the superconducting metal is lead-bismuth containing from 30 to 56% bismuth and the remainder lead.

13. A superconducting coil, said coil comprising at least one winding of a plurality of fine superconductor filaments, said superconductor filaments being disposed in a metal matrix over most of their length, the ends of said superconductor filaments being liberated from and being free of said matrix metal, said liberated ends being held together to form a filament-to-filament joint and being at least partially immersed in a body of solidified lead-bismuth alloy.

14. The coil of claim 13 wherein said filaments are of niobium-titanium and are less than 100 microns in diameter.

15. The coil of claim 13 wherein the matrix metal is selected from the group consisting of copper and alloys of copper.

16. The coil of claim 13 wherein the lead-bismuth alloy is 5 to 98% lead and the remainder bismuth.

17. The coil of claim 13 wherein the lead-bismuth alloy is 44 to 70% lead and the remainder bismuth.

18. A superconducting coil comprising a coil of at least one turn of superconducting wire, said wire having multiple fine filaments of superconductor extending lengthwire through an elongated matrix metal, said coil having at least one wire to wire joint, said joint containing filaments of said superconductor released from said matrix metal, the released superconductor filaments of each wire being embedded in the same solidified body of superconducting solder metal.

19. The coil of claim 18 wherein said filaments are of niobium-titanium and aare less than 100 microns in diameter.

20. A superconducting joint comprising first and second sets of fine filaments of niobium-titanium alloy, filaments of said first set being held in contiguous relation with filaments of said second set to provide a superconducting path therebetween, filaments of said sets being surface coated with at least a zero amount to at most a minor amount of tin and being frozen in a common body of lead-bismuth.

21. The superconducting joint of claim 20 wherein said filaments are less than 100 microns in diameter.

* * * * *